(12) United States Patent
Song et al.

(10) Patent No.: US 6,872,473 B2
(45) Date of Patent: Mar. 29, 2005

(54) PANEL DISPLAY DEVICE AND METHOD FOR FORMING PROTECTIVE LAYER WITHIN THE SAME

(75) Inventors: Won Jun Song, Seoul (KR); Jung Hwan Yang, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 182 days.

(21) Appl. No.: 10/196,127

(22) Filed: Jul. 17, 2002

(65) Prior Publication Data

US 2003/0017297 A1 Jan. 23, 2003

(30) Foreign Application Priority Data

Jul. 20, 2001 (KR) ........................ P2001-43756

(51) Int. Cl.⁷ ...................... H05B 33/04; H05B 33/10
(52) U.S. Cl. ...................... 428/690; 428/68; 428/76; 428/332; 428/421; 428/426; 428/448; 428/522; 428/917; 313/512; 257/100
(58) Field of Search ................ 428/68, 76, 332, 428/421, 426, 448, 522, 690, 917; 313/512; 257/100; 427/66, 402

(56) References Cited

U.S. PATENT DOCUMENTS

2001/0054867 A1   12/2001   Kubota ........................ 313/504

FOREIGN PATENT DOCUMENTS

| EP | 0 917 410 A1 | 5/1999 |
| EP | 0 977 469 A2 | 2/2000 |
| JP | 2001-148287 | 5/2001 |
| WO | WO 00/65670 | 11/2000 |

*Primary Examiner*—Dawn Garrett
(74) *Attorney, Agent, or Firm*—Fleshner & Kim LLP (57) ABSTRACT

A panel display device and a method for forming a protective layer within the same are disclosed, in which protective layers having a multi-layered sealing structure are provided to avoid any degradation caused by an external factor such as $O_2$ or moisture. The panel display device includes a substrate, an organic EL layer formed on the substrate, a barrier dividing the organic EL layer, and a multi-layered protective layer formed on the organic EL layer.

24 Claims, 7 Drawing Sheets

PANEL DISPLAY DEVICE AND METHOD FOR FORMING PROTECTIVE LAYER WITHIN THE SAME

This application claims the benefit of the Korean Application No. P2001-43756 filed on Jul. 20, 2001, which is hereby incorporated by reference.

BACKGROUND OF THE INVENTION

1. Field of the Invention

The present invention relates to a display device, and more particularly, to a panel display device and a method for forming a protective layer within the same in which a flat type panel display device is formed using organic electroluminescence (EL).

2. Discussion of the Related Art

Generally, organic light-emitting diode (OLED) is very susceptible to the atmospheric gas. Accordingly, if the OLED is exposed to the atmospheric gas, lifetime is reduced. Particularly, an organic EL layer in a panel display device may be oxidized if it is exposed to the atmospheric gas. This is because that the organic EL layer is active to the moisture or $O_2$. Likewise, electrodes such as cathodes or anodes are likely to be oxidized if they are exposed to the atmospheric gas. An oxide is produced between the electrode surface and the organic EL layer due to oxidation of the electrodes. In this case, a problem arises in that the oxide causes leakage and short in the display device.

In this respect, Mg—Ag and/or Al—Li has been used to improve efficiency of an organic EL element. However, problems such as edge shorting, dark spot and decrease of a luminescent area still exist in that Mg—Ag and Al—Li are more susceptible to $O_2$ in the air.

To solve such problems, a device of a sealing structure has been required, which does not allow gases in the air to cause oxidation or deformation of an organic EL layer and electrodes.

The sealing structure is generally formed by either a method using silicon oil and resin or a film formation method.

The method using silicon oil and resin has been used for sealing of an inorganic EL element and is applicable to OLEDs. If this method is used for OLEDs, a solvent of silicon oil and resin is permeated into the organic EL layer and the electrode surface, thereby degrading luminescence characteristics and efficiency.

The film formation method is to form a protective layer outside an organic EL element which is laminated, using a physical vapor deposition (PVD), a chemical vapor deposition (CVD), a plasma enhanced CVD (PECVD), or sputtering. In the film formation method, electrical resistance, rupture strength, and moisture resistance serve to prevent an organic EL layer and electrodes from being oxidized or deformed.

In the aforementioned related art sealing structure, when the organic EL element is driven, it is likely to be damaged by a small content of $O_2$ or moisture (e.g., 1 ppm). For this reason, luminescence characteristic and efficiency of the display device are degraded.

SUMMARY OF THE INVENTION

Accordingly, the present invention is directed to a panel display device and a method for forming a protective layer within the same that substantially obviates one or more problems due to limitations and disadvantages of the related art.

An object of the present invention is to provide a panel display device and a method for forming a protective layer within the same, which has a multi-layered sealing structure to avoid any degradation caused by an external factor such as $O_2$ or moisture.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a panel display device includes a substrate, an organic EL layer formed on the substrate, a barrier dividing the organic EL layer, and a multi-layered protective layer formed on the organic EL layer.

Preferably, the multi-layered protective layer includes a first protective layer formed of a high polymer compound containing fluorine at the lowest part, a second protective layer formed of a silicon composite, a third protective layer formed of a compound hardened by polymerization at a room temperature and a normal pressure, and a fourth protective layer formed of a number of layers adhered to one another at the most upper part.

In another aspect of the present invention, a method for forming a multi-layered protective layer in a panel display device including a substrate, an organic EL layer, a barrier, and the multi-layered protective layer, includes a) forming a first protective layer of a high polymer compound containing fluorine at the lowest part, b) forming a second protective layer of a silicon composite on the first protective layer, c) forming a third protective layer of a compound on the second protective layer, the compound being hardened by polymerization at a room temperature and a normal pressure, and d) forming a fourth protective layer on the third protective layer, the fourth protective layer having a number of layers adhered to one another.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 3A to 3E illustrate structures of a protective layer provided in a panel display device according to the present invention, in which

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
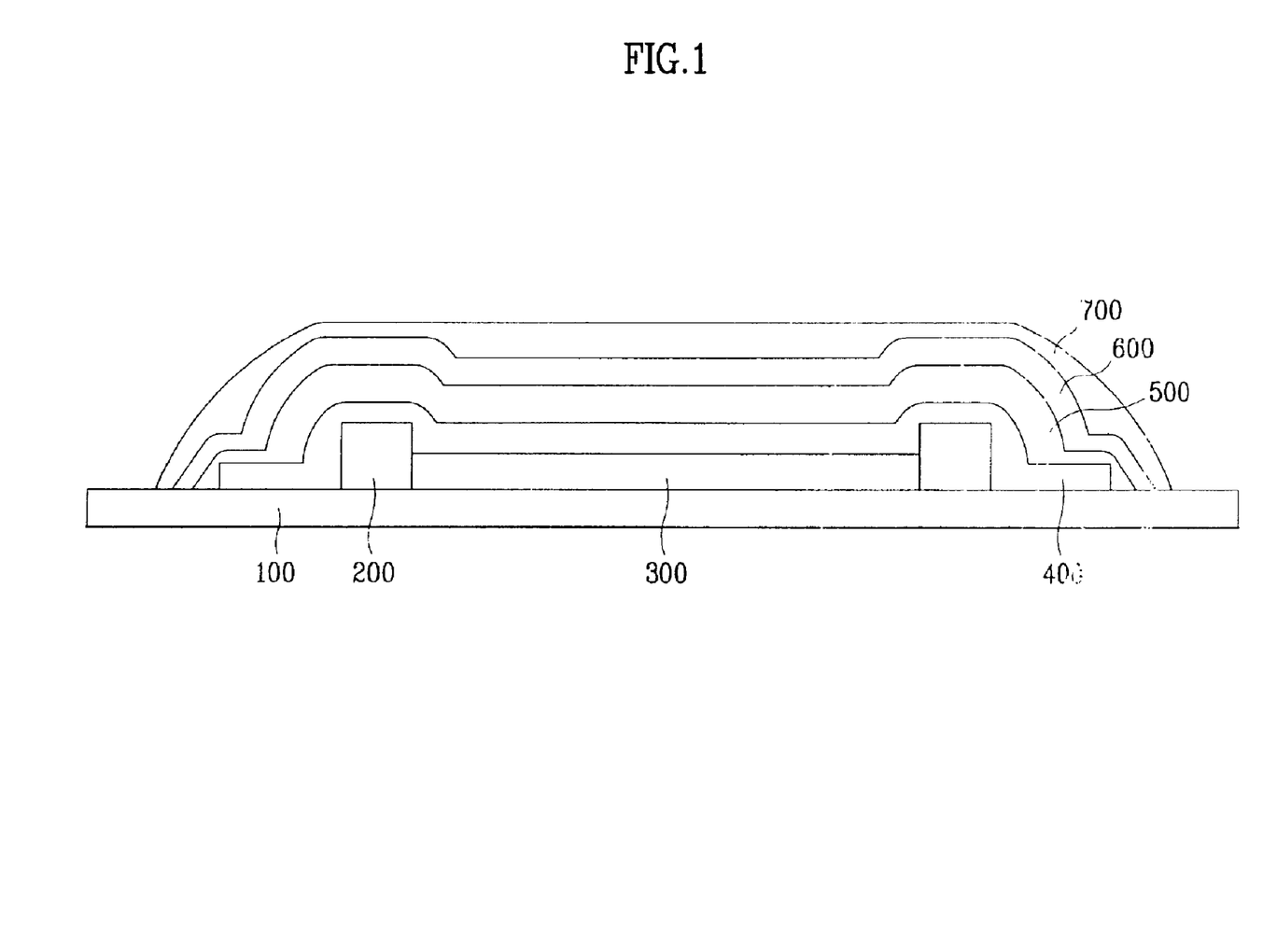
FIG. 1 is a sectional view illustrating a luminescent structure of a panel display device according to the present invention.

FIG. 1 is a sectional view illustrating a luminescent structure of a panel display device according to the present invention.

Referring to FIG. 1, a panel display device of the present invention includes a lower substrate 100, an organic EL layer 300 formed on the lower substrate 100, a barrier 200 for dividing the organic EL layer 300, and multi-layered protective layers 400, 500, 600 and 700 formed on the organic EL layer 300. The multi-layered protective layers 400, 500, 600 and 700 are formed in a layered structure having no space. A reference numeral 400 represents a first protective layer, 500 represents a second protective layer, 600 represents a third protective layer, and 700 represents a fourth protective layer.

The organic EL layer 300 has a structure in which an organic semiconductor layer is formed between the anode and the cathode. The organic semiconductor layer is formed in combination with a hole injection layer, a hole transport layer, a luminescent layer, an electron transport layer, or an electron injection layer in accordance with its purpose of use.

The organic EL layer 300, as shown in FIG. 1, is divided by the barrier 200, and is represented by one of display pixels formed in a matrix arrangement.

The four multi-layered protective layers 400, 500, 600 and 700 are layered on the organic EL layer 300 without any space.

The protective layers 400, 500, 600 and 700 are formed using one of PVD, CVD, PECVD, and sputtering.

The first to fifth protective layers 400, 500, 600 and 700 will now be described in more detail.

The first protective layer 400 is formed of a high polymer compound containing fluorine. Poly-chloro-trifluoro-ethylene or poly-dichloro-trifluoro-ethylene is used as the high polymer compound. Also, either a high polymer compound, such as chloro-trifluoro-ethylene and dichloro-trifluoro-ethylene, or a co-polymer such as chloro-trifluoro-ethylene and dichloro-trifluoro-ethylene is used as the first protective layer 400.

A molecular weight of the aforementioned high polymer compound is used within the range of 1,000 gram/mole to 300,000 gram/mole. More preferably, the high polymer compound has a molecular weight within the range of 1,000 gram/mole to 3,000 gram/mole in the present invention.

Also, the first protective layer 400 can be grown by irradiating ultraviolet (UV) light after depositing an organic matter using the PVD(physical vapor deposition). In this case, stearyl acrylate, lauryl acrylate, 2-phenoxyethyl acrylate, isodecyl acrylate, isooctyl acrylate, iso bornyl acrylate, 1,3-butylene glycol diacrylate, 1,4-butanediol diacrylate, 1,6-hexanediol diacrylate, ethoxylated bisphenol A diacrylate, propoxylated neophentyl glycol diacrylate, tris(2-hydroxylethyl) isocyannurate triacrylate, or trimethylolpropane tracrylate may be used.

Furthermore, the first protective layer 400 can be formed by growing a high polymer thin film using the PECVD (plasma enhanced chemical vapor deposition). In this case, a florine based gas such as $CF_4$, $C_2F_4$, $C_2F_5H$, $C_2F_4H_2$, and $NF_3$ can be used as a reaction gas. Benzene, naphthalene, or acetylene can be used as a carbon compound. If a florine based gas is used, a thin film of a net structure, such as Teflon, can be obtained. Preferably, $C_2F_4$ and $C_2F_4H_2$ can be used.

The first protective layer 400 has a thickness of 0.1~10 $\mu$m.

If the first protective layer is formed using the PVD, the high polymer compound of 0.1~10 nm/$\epsilon$ is deposited. If the deposition speed is fast when the first protective layer 400 is formed, surface morphology becomes rough. Therefore, the first protective layer 400 is deposited in such a way that grain is grown below 1 $\mu$m and a temperature of the substrate 100 is within the range of 50~100° C.

The second protective layer 500 is formed of silicon composite. SiC, SiO, $SiO_2$, or $Si_XN_Y$ (X and Y are natural numbers) is used as the silicon composite. More preferably, $SiO_2$, or $Si_XN_Y$ is used as the silicon composite. The silicon composite is deposited using E-beam deposition or PECVD.

Particularly, to give the moisture absorption characteristic to the second protective layer 500, any one of Cs, CaO, Na, Li, Mg, and K is co-deposited on the silicon composite at a concentration of 1~10%.

$Si_XN_Y$ or $TiN_X$ thin film is deposited on the most upper layer of the second protective layer which is in contact with the third protective layer, so as to avoid flaking.

The third protective layer 600 is formed of an epoxy based compound, silicon compound, or acrylate based compound. The epoxy based compound is hardened by polymerization at a room temperature and a normal pressure. A compound having low volatility and high melting point, which is a photo-hardening material, is used as the epoxy based compound. Acrylate of a long chain structure such as trimethyl propane triacrylate, ditrimethylolpropane tetraacrylate, trimethylacrylate, 1,6-exanediol-diacrylate, or 1,6-hexanediol dimethacrylate is used as the third protective layer 600.

The third protective layer 600 is to reduce stress of the first and second protective layers 400 and 500. A hardener is applied to the third protective layer 600 to adhere a film having mechanical and protective characteristics.

The epoxy based compound is coated in such a way that it is deposited by PVD and hardened by irradiating ultraviolet (UV). The epoxy based compound has semi-transparent characteristics. In addition, the epoxy based compound is coated by a spin-coating method, a spray method, or a Dr. Blade method.

By contrast, the third protective layer 600 has transparent characteristics if the silicon compound is used as the third protective layer 600. In this case, RT-glass or a silicon sealant is used as the silicon compound. The sealant of the silicon compound is used for a top-emission sealing structure due to its high transmittivity.

The sealing structure of the silicon compound is formed by a spray method, a spin-coating method, or a Dr. Blade method.

Finally, the fourth protective layer 700 is formed of a number of layers adhered to one another.

The fourth protective layer 700 is to prevent the atmospheric gas from being transmitted and has mechanical characteristics. To this end, the fourth protective layer 700 is formed of glass or high polymer film.

Figure 2:
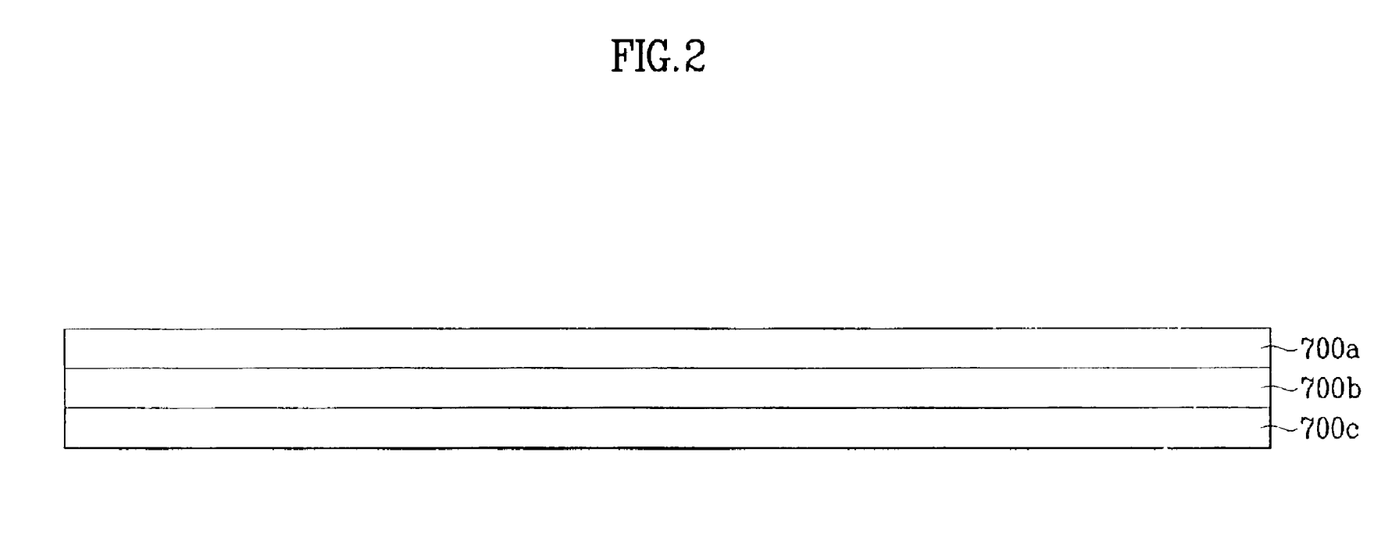
FIG. 2 is a detailed view illustrating a partial structure of a protective layer provided in a panel display device according to the present invention.

FIG. 2 is a detailed view illustrating a structure of the fourth protective layer provided in the panel display device according to the present invention. The fourth protective layer 700 includes a first layer 700a, a second layer 700b, and a third layer 700c. Polyethylene terephthalate (PET), poly methyl methacrylate (PMMA), or fluorine based high polymer compound is used as the first layer 700a. The second layer 700b is treated with plasma. The third layer 700c is formed of an organic layer at the lowest part. In addition to the organic layer, a metal oxide layer, an organic-inorganic hybrid layer, or a metal complex layer may be used as the third layer 700c. In this case, the third layer 700c is adhered to the sealant that forms the third protective layer 600.

PET, PMMA, or fluorine based high polymer compound used as the first layer 700a of the first protective layer 700 has a molecular weight within the range of 20,000 gram/mole to 250,000 gram/mole. The first layer 700a has a thickness of 100~1000 µm.

In the present invention, glass of a low melting temperature is separately used to form the first layer 700a.

The second layer 700b of the fourth protective layer 700 is treated with plasma to obtain oxidizing characteristics. In this case, adhesion increases when the sealant that forms the third protective layer 600 is adhered to the fourth protective layer 700 (in more detail, the third layer of the fourth protective layer 700).

The organic layer, the metal oxide layer, the organic-inorganic hybrid layer, or the metal complex layer that forms the third layer 700c of the fourth protective layer 700 is formed by gas absorption through PVD, CVD, or PECVD. In this case, organic material, metal oxide, organic-inorganic compound, or metal complex is used.

FIG. 3 illustrates structures of the protective layer provided in the display device according to the present invention.

Figure 3A:
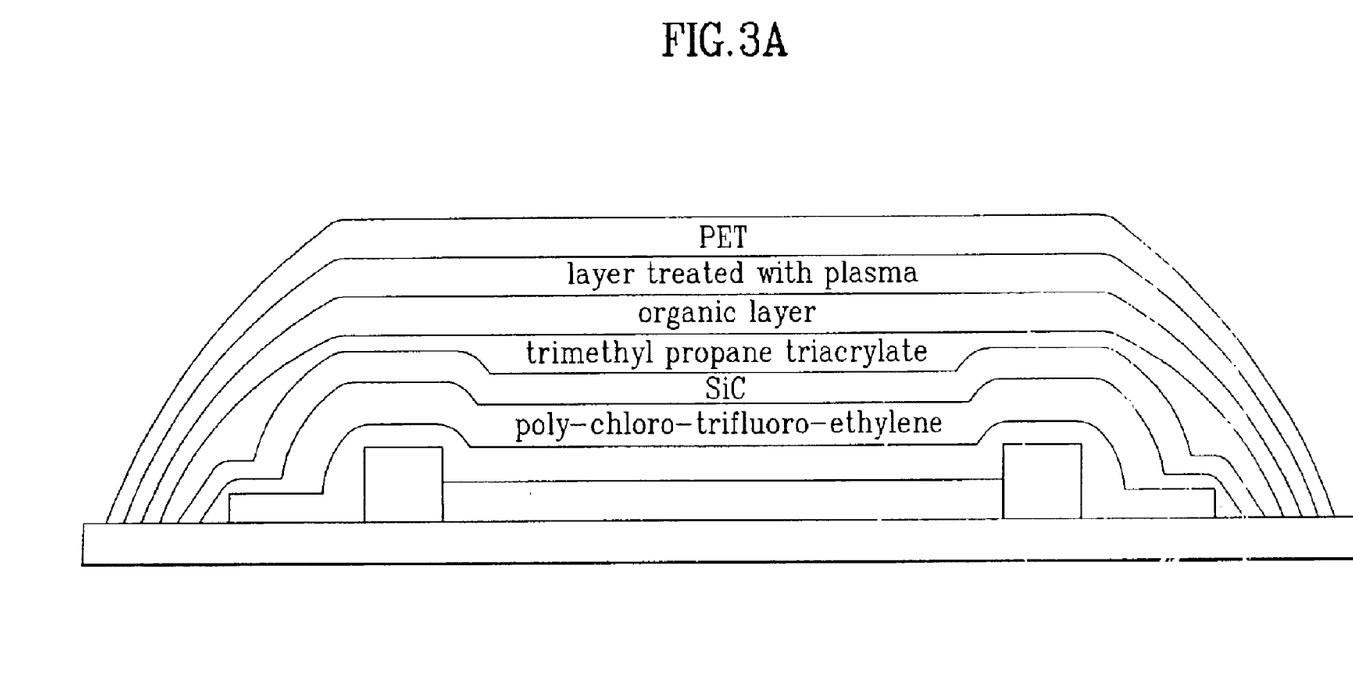
FIG. 3A illustrates a structure of a protective layer according to the first embodiment of the present invention.

FIG. 3A illustrates a structure of the protective layer according to the first embodiment of the present invention. Referring to FIG. 3A, poly-chloro-trifluoro-ethylene is used as the first protective layer 400, SiC is used as the second protective layer 500, and trimethyl propane triacrylate which is epoxy based compound is used as the third protective layer 600. PET is used as the first layer 700a of the fourth protective layer 700, and the organic layer is used as the third layer 700c. The second layer 700b is treated with plasma.

Figure 3B:
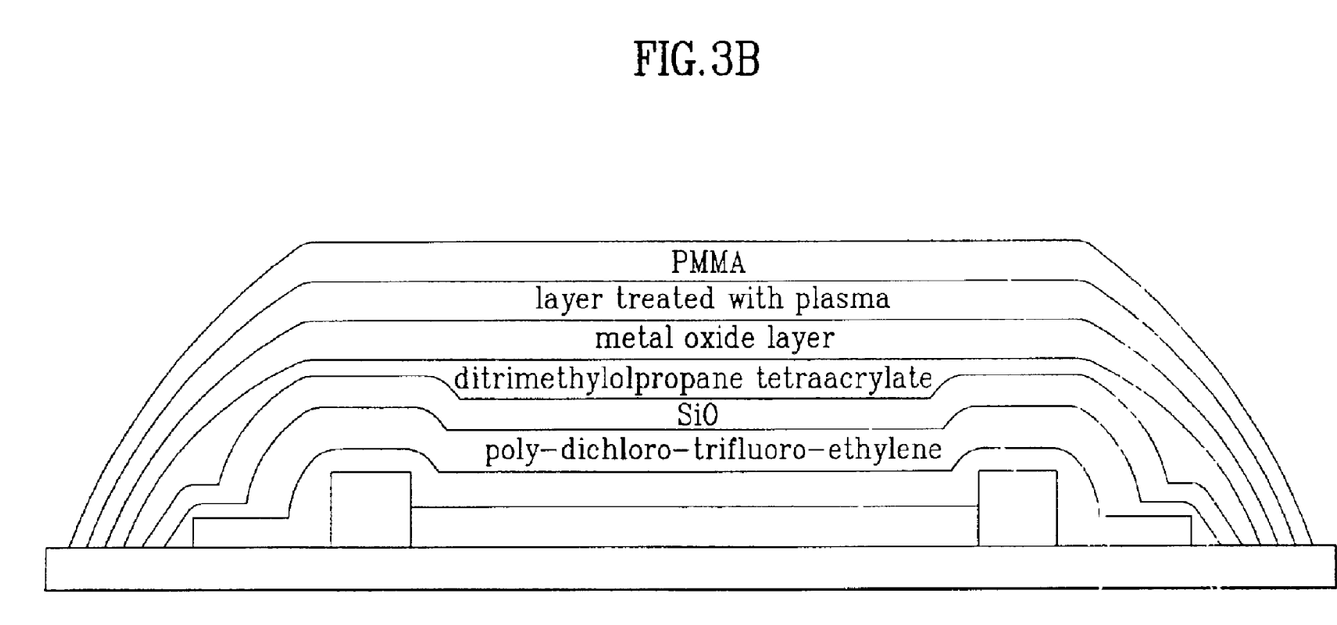
FIG. 3B illustrates a structure of a protective layer according to the second embodiment of the present invention.

FIG. 3B illustrates a structure of the protective layer according to the second embodiment of the present invention. Referring to FIG. 3B, poly-dichloro-trifluoro-ethylene is used as the first protective layer 400, SiO is used as the second protective layer 500, and ditrimethylolpropane tetraacrylate which is epoxy based compound is used as the third protective layer 600. PMMA is used as the first layer 700a of the fourth protective layer 700, and the metal oxide layer is used as the third layer 700c. The second layer 700b is treated with plasma.

Figure 3C:
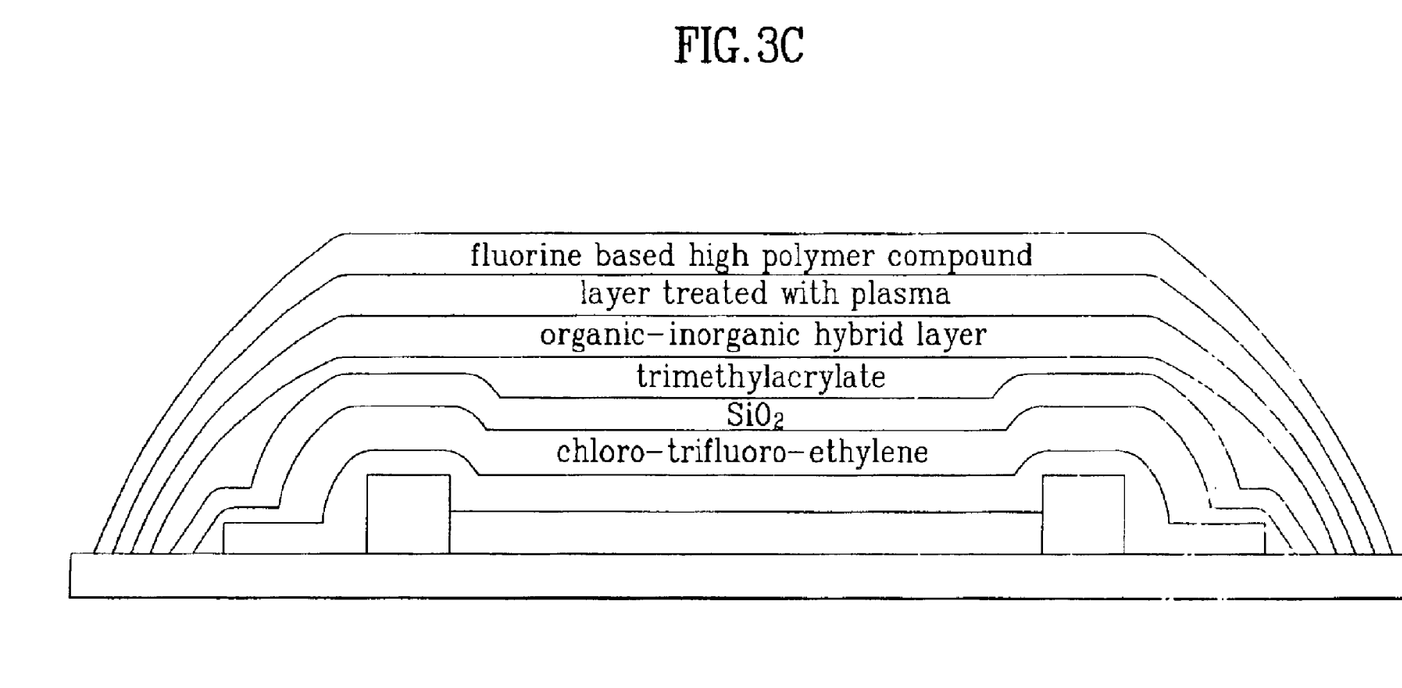
FIG. 3C illustrates a structure of a protective layer according to the third embodiment of the present invention.

FIG. 3C illustrates a structure of the protective layer according to the third embodiment of the present invention. Referring to FIG. 3C, chloro-trifluoro-ethylene is used as the first protective layer 400, $SiO_2$ is used as the second protective layer 500, and trimethylacrylate is used as the third protective layer 600. Fluorine based high polymer compound is used as the first layer 700a of the fourth protective layer 700, and the organic-inorganic hybrid layer is used as the third layer 700c. The second layer 700b is treated with plasma.

Figure 3D:
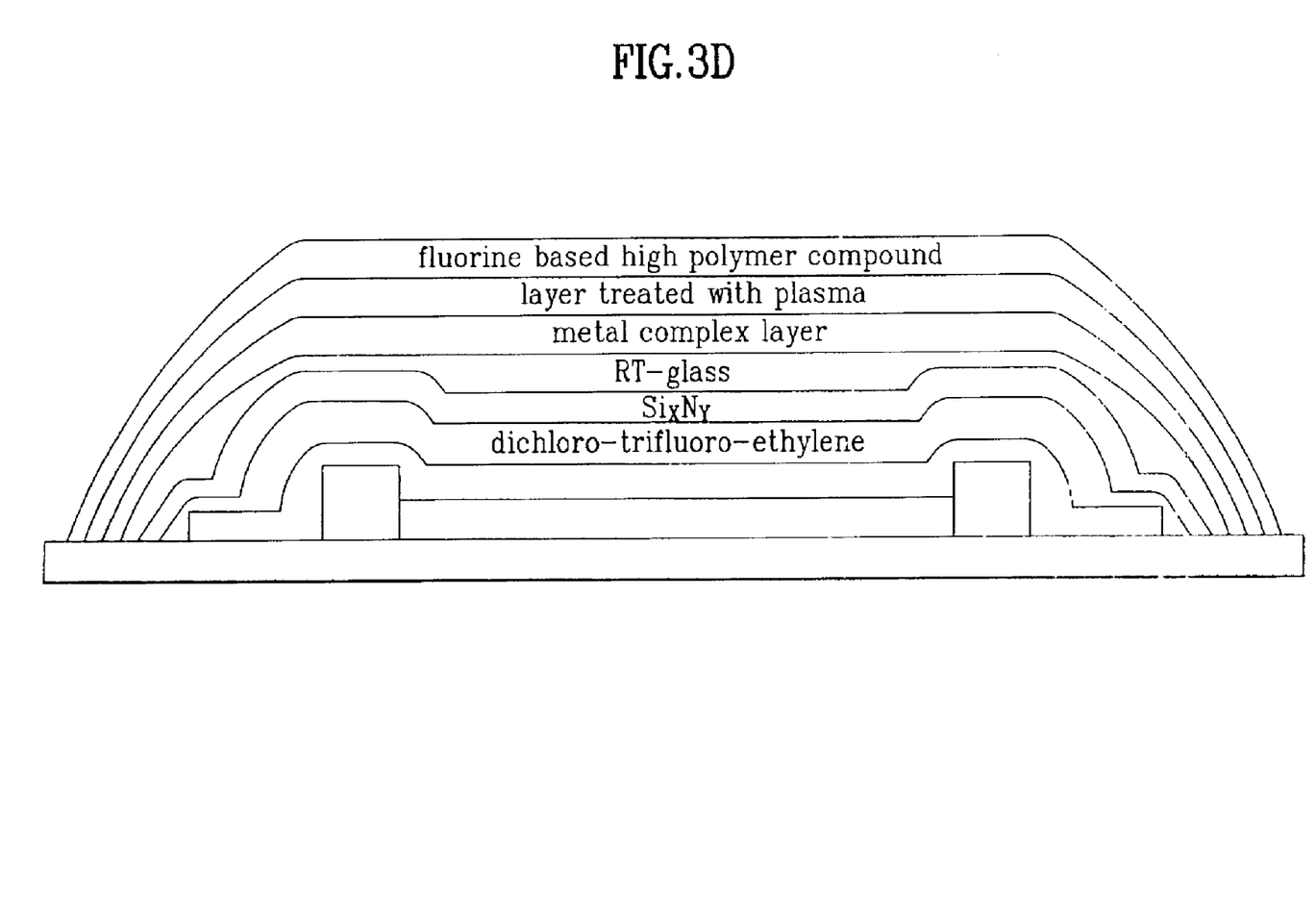
FIG. 3D illustrates a structure of a protective layer according to the fourth embodiment of the present invention.

FIG. 3D illustrates a structure of the protective layer according to the fourth embodiment of the present invention Referring to FIG. 3D, dichloro-trifluoro-ethylene is used as the first protective layer 400, $Si_XN_Y$ (X and Y are natural numbers) is used as the second protective layer 500, and RT-glass is used as the third protective layer 600. Fluorine based high polymer compound is used as the first layer 700a of the fourth protective layer 700, and the metal complex layer is used as the third layer 700c. The second layer 700b is treated with plasma.

Figure 3E:
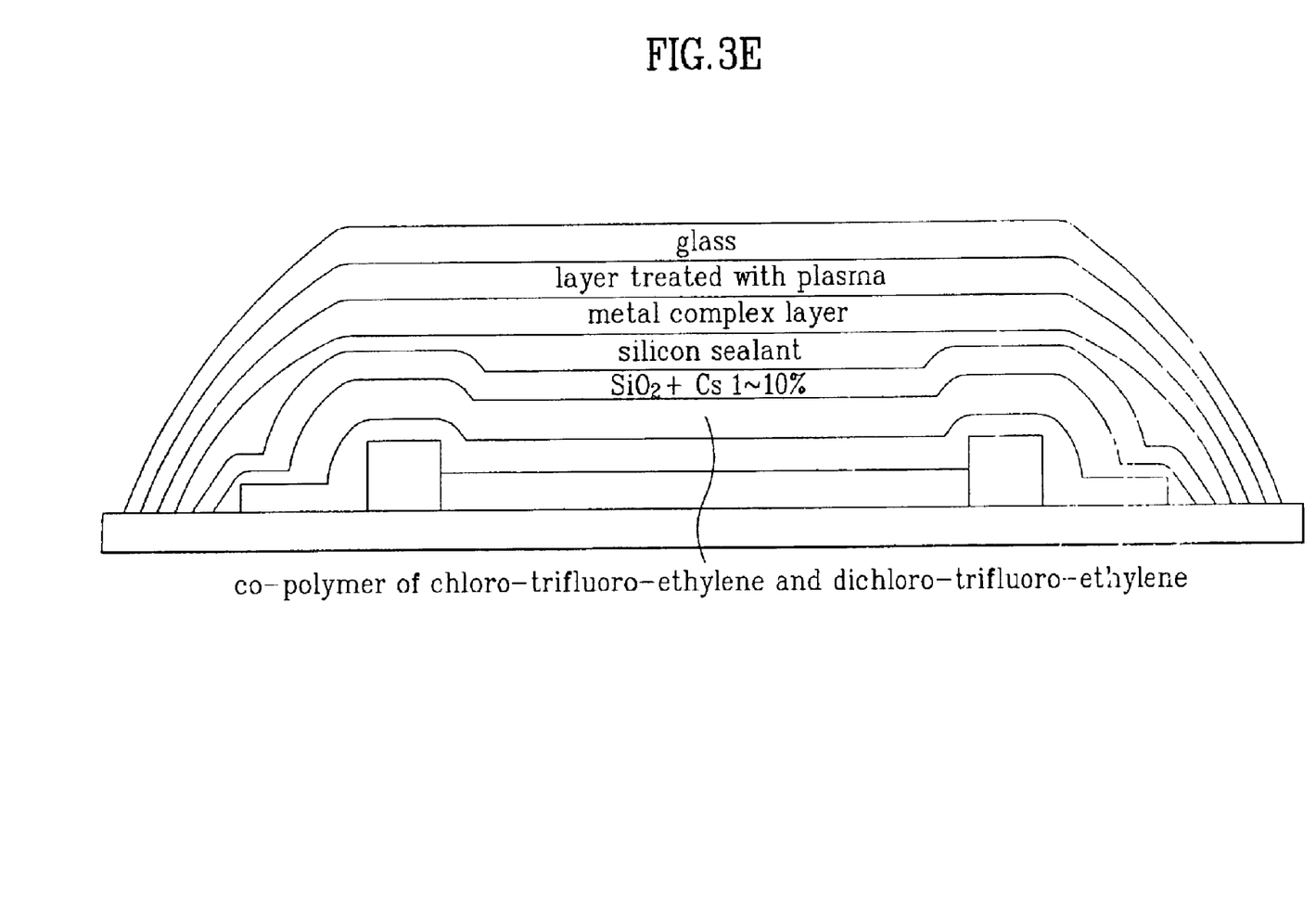
FIG. 3E illustrates a structure of a protective layer according to the fifth embodiment of the present invention.

FIG. 3E illustrates a structure of the protective layer according to the fifth embodiment of the present invention. Referring to FIG. 3E, co-polymer of chloro-trifluoro-ethylene and dichloro-trifluoro-ethylene is used as the first protective layer 400, $SiO_2$ and Cs of 1~10% are used as the second protective layer 500, and a silicon sealant is used as the third protective layer 600. Glass of low melting temperature is used as the first layer 700a of the fourth protective layer 700, and the metal complex layer is used as the third layer 700c. The second layer 700b is treated with plasma.

As aforementioned, the panel display device and the method for forming a protective layer within the same have the following advantages.

The protective layer having a multi-layered structure is to block an external factor (e.g., transmittance of the atmospheric gas such as moisture or $O_2$). In other words, since the protective layer is formed in a layered structure without any space, it is possible to remarkably reduce transmittance of $O_2$ or moisture. In this case, luminescent characteristics and efficiency of the display device can be improved. Also, stability of the display device is maintained for a longer time than the existing sealing structure.

Finally, the display device of the present invention can be used for the top emission sealing structure due to high photo-transmittivity.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A panel display device comprising:
    a substrate;
    an organic EL(electroluminescence) layer formed on the substrate;
    a barrier dividing the organic EL layer; and
    a multi-layered protective layer formed on the organic EL layer, comprising
    a first protective layer formed of a polymer compound containing fluorine, a second protective layer formed of a silicon composite, a third protective layer formed of a compound hardened by polymerization, and a fourth protective layer formed of at least two sub-layers adhered to one another.

2. The panel display device of claim 1, wherein the device has a sealing structure.

3. The panel display device of claim 1, wherein the first protective layer is formed of poly-chloro-trifluoro-ethylene, poly-dichloro-trifluoro-ethylene, chloro-trifluoro-ethylene, dichloro-trifluoro-ethylene, or a co-polymer of chloro-trifluoro-ethylene and dichloro-trifluoro-ethylene.

4. The panel display device of claim 1, wherein the first protective layer is formed of a polymer compound having a molecular weight within the range of 1,000 gram/mole to 3,000 gram/mole.

5. The panel display device of claim 1, wherein the first protective layer has a thickness of 0.1~10 mm.

6. The panel display device of claim 1, wherein the second protective layer is formed or co-deposited using SiC, SiO, $SiO_2$, or $Si_X N_Y$ (X and Y are natural numbers).

7. The panel display device of claim 1, wherein the second protective layer includes any one of Cs, CaO, Na, Li, Mg and K within the range of 1~10%.

8. The panel display device of claim 1, wherein the third protective layer is formed of an epoxy based compound, silicon compound, or acrylate based compound.

9. The panel display device of claim 1, wherein the third protective layer is formed of a compound, which is hardened by polymerization.

10. The panel display device of claim 1, wherein the third protective layer is formed of an acrylate based compound.

11. The panel display device of claim 1, wherein the third protective layer is formed of trimethyl propane triacrylate, ditrimethylolpropane tetraacrylate, or trimethylacrylate.

12. The panel display device of claim 1, wherein the third protective layer is formed of glass or a silicon sealant to form a transparent layer.

13. The panel display device of claim 1, wherein the fourth protective layer has a three-layered structure including glass or polymer film.

14. The panel display device of claim 1, wherein the fourth protective layer has a top most layer which is formed of polyethylene terephthalate (PET), poly methyl methacrylate (PMMA), or fluorine based polymer compound.

15. The panel display device of claim 14, wherein the top most layer of the fourth protective layer is formed of a compound having a molecular weight within the range of 20,000 gram/mole to 250,000 gram/mole.

16. The panel display device of claim 14, wherein the top most layer of the fourth protective layer is formed with a thickness of 100~1000 mm.

17. The panel display device of claim 14, wherein the top most layer of the fourth protective layer is formed of glass.

18. The panel display device of claim 14, wherein a layer below the top most layer is treated with plasma.

19. The panel display device of claim 1, wherein the fourth protective layer has a bottom most layer which is formed of an organic material, metal oxide, organic-inorganic hybrid, or metal complex.

20. The panel display device of claim 1, wherein the first protective layer is formed by the steps of depositing an organic material by using PVD (physical vapor deposition) and irradiating ultraviolet (UV) light into the organic material.

21. The panel display device of claim 20, wherein the organic material is one of stearyl acrylate, lauryl acrylate, 2-phenoxyethyl acrylate, isodecyl acrylate, isooctyl acrylate, iso bornyl acrylate, 1,3-butylene glycol diacrylate, 1,4-butanediol diacrylate, 1,6-hexanediol diacrylate, ethoxylated bisphenol A diacrylate, propoxylated neophentyl glycol diacrylate, tris(2-hydroxylethyl) isocyannurate triacrylate, and trimethylolpropane tracrylate.

22. The panel display device of claim 1, wherein the first protective layer is formed by growing a polymer thin film using PECVD(plasma enhanced chemical vapor deposition) by using a fluorine based gas and a carbon compound.

23. The panel display device of claim 22, wherein the fluorine based gas is one of $CF_4$, $C_2F_4$, $C_2F_5H$, $C_2F_4H_2$, and $NF_3$.

24. The panel display device of claim 22, wherein the carbon compound is one of benzene, naphthalene, and acetylene.

* * * * *